United States Patent [19]

Yamanaka et al.

[11] Patent Number: 4,785,342

[45] Date of Patent: Nov. 15, 1988

[54] STATIC RANDOM ACCESS MEMORY HAVING STRUCTURE OF FIRST-, SECOND- AND THIRD-LEVEL CONDUCTIVE FILMS

[75] Inventors: Toshiaki Yamanaka, Hoya; Yoshio Sakai, Shiroyama; Shinpei Iijima, Akishima; Osamu Minato, Hinode; Shigeru Honjyo, Hachioji, all of Japan

[73] Assignee: Hitachi, Ltd., Tokyo, Japan

[21] Appl. No.: 8,325

[22] Filed: Jan. 29, 1987

[30] Foreign Application Priority Data

Jan. 29, 1986 [JP] Japan .................. 61-15626

[51] Int. Cl.4 ............ H01L 27/10; H01L 29/04; H01L 49/02; H01L 29/40
[52] U.S. Cl. .................... 357/51; 357/59; 357/71
[58] Field of Search ............. 357/51, 59, 71

[56] References Cited

U.S. PATENT DOCUMENTS 4,370,798  2/1983  Lien et al. .............. 357/59
4,528,582  7/1985  Cohen et al. ........... 357/59

FOREIGN PATENT DOCUMENTS 56-150845  11/1981  Japan ................. 357/51
59-165447  9/1984  Japan ................. 357/51

Primary Examiner—Andrew J. James
Assistant Examiner—John Lamont
Attorney, Agent, or Firm—Antonelli, Terry & Wands

[57] ABSTRACT

A resistance element having a reduced occupied area and a high resistance which may be employed as a load resistor used in, for example, a static memory device. A high-resistance area is formed using a relatively thin film, while an interconnection area is formed using a relatively thick film, and these films are provided in such a manner that the thin film is in contact with the upper side of the thick film (the relatively thick film is a first-level film, and the relatively thin film is a second-level film).

22 Claims, 5 Drawing Sheets

STATIC RANDOM ACCESS MEMORY HAVING STRUCTURE OF FIRST-, SECOND- AND THIRD-LEVEL CONDUCTIVE FILMS

BACKGROUND OF THE INVENTION

The present invention relates to a semiconductor device and, more particularly, to a semiconductor device such as a static random access memory which has a high-resistance element having a high resistance and which is suitable for realizing larger scale integration.

FIG. 1 is a circuit diagram of a static random-access memory cell which is composed of a flip-flop circuit consisting of driver MOS transistors $Tr_1$ and $Tr_2$ and load resistors $R_1$ and $R_2$, and transfer MOS transistors $Tr_3$ and $Tr_4$. The memory cell is selected through a word line 13 and data lines 12 to read out data. The load resistors $R_1$ and $R_2$ have a high resistance, i.e., $10^{10}$ to $12^{12}$ Ω. Such load resistors $R_1$ and $R_2$ are provided for the purpose of compensating for leakage current which may flow when the MOS transistors $Tr_1$ and $Tr_2$ constituting the flip-flop circuit are at "high" level, thereby supplying a current sufficient to enable a static operation to the drain of each of the MOS transistors $Tr_1$ and $Tr_2$, and also for the purpose of reducing the stand-by current in the memory. High-resistance elements having the above-described characteristics have heretofore been formed by employing a polycrystalline silicon film. However, to form high-resistance elements suitable for large scale integration, it is an effective practice to reduce the width of such high-resistance polycrystalline silicon film or reduce the thickness of the film. Reduction in the width of the film owes much to the microfabrication technology, and reduction in the film thickness leads to problems such as an increase in resistance of the interconnection area other than the high-resistance area and undesirable etching of the polycrystalline silicon film in the step of etching contact holes for connection with electrodes of aluminum or the like.

One type of method of reducing the thickness of a polycrystalline silicon film is disclosed in the specification of Japanese Patent Laid-Open No. 210658/1984. More specifically, as shown in FIG. 2 herein, a thick insulator 2 is provided on a P-type semiconductor substrate 1, and a thin polycrystalline silicon film 3 is provided all over the surface of the insulator 2 and formed into a desired pattern by a photolithographic technique. Further, a thick polycrystalline silicon film 4 is provided in a similar manner and covered with an insulator 5, and openings are formed to provide electrodes 6 of aluminum or the like. The present inventors produced a resistor having the structure shown in FIG. 2 and have found the following problems. Namely, although a high resistance is obtained by means of the thin polycrystalline silicon film 3 in the prior art structure shown in FIG. 2, when the thick polycrystalline silicon film 4 at the connection with the aluminum electrodes 6 is etched, the thin polycrystalline silicon film 3, which is an underlayer, is undesirably etched by overetching, which overetching needs to be carried out due to nonuniformity in thickness of the thick polycrystalline silicon film 4 and due to nonuniformity in etching rate within the silicon wafer. More specifically, if it is assumed that the thickness of the thin polycrystalline silicon film 3 is represented by $t_1$, the thickness of the thick polycrystalline silicon film 4 by $t_2$, the rate of nonuniformity in film thickness by $\alpha$, and the rate of nonuniformity in etching rate by $\beta$, the thin polycrystalline silicon film 3 is completely etched away when the following condition is met:

$$t_1 < \alpha \cdot \beta \cdot t_2 \tag{1}$$

Even when the following condition is satisfied, i.e., $$t_1 > \alpha \cdot \beta \cdot t_2 \tag{2}$$

if the thin polycrystalline silicon film 3 is etched, the nonuniformity in the film thickness further increases to make it difficult to control the film thickness, resulting, disadvantageously, in an increase in variation of resistance.

SUMMARY OF THE INVENTION

In view of the above-described circumstances, it is an object of the present invention to provide a resistance elements such as load resistors of a static random access memory, which has a reduced necessary area and is readily produced, and a method for forming such resistance element.

It is another object of the present invention to provide a resistance element which has a small device size and whose resistance is readily controlled.

It is still another object of the present invention to provide a static memory including a load element having a reduced occupied area and a high resistance.

Generally, the present invention provides a resistance element having a structure in which a first conductor film is formed over a substrate, with a second conductor film formed so as to extend over at least part of the first conductor film, so that part of the second conductor film is stacked on the first conductor film. The second conductor film (e.g., a second level film) has a relatively high resistivity as compared to the resistivity of the first conductor film (e.g., a first level film), and is relatively thin as compared to the thickness of the first conductor film. Such second conductor film constitutes a high-resistance area of the resistance element. More specifically, the present invention provides a resistance element having a structure in which an interconnection area is formed using a relatively thick first polycrystalline silicon film, and a high-resistance area is formed using a relatively thin second polycrystalline silicon film, the thin second polycrystalline silicon film being connected to the upper side of the thick first polycrystalline silicon film. Even more specifically, the present invention provides a static random access memory having MOS transistors, a power supply line and load resistors, wherein gate electrodes of the MOS transistors are formed of a first-level film of polycrystalline silicon, the power supply line is formed of a second-level film of polycrystalline silicon (relatively thick and heavily doped), and the load resistors are formed of a third-level film of polycrystalline silicon (relatively thin and undoped). By virtue of this arrangement, when the thick first polycrystalline silicon film is processed, it is possible to suppress the reduction in the film thickness of the thick first polycrystalline silicon film under the second polycrystalline silicon film, and even when the film thickness of the first polycrystalline silicon film is slightly reduced, there is no effect on the resistance, so that changes in the manufacturing process is allowed, and this facilitates process control. In addition, it is possible to obtain a semiconductor device which enables miniaturization and large scale integration.

These and other objects and many of the attendant advantages of this invention will be readily appreciated as the same becomes better understood by reference to the following detailed description when considered in connection with the accompanying drawings.

DETAILED DESCRIPTION OF THE INVENTION

The present invention will be described hereinunder in detail by way of embodiments and with reference to the accompanying drawings.

EMBODIMENT 1

Figure 1:
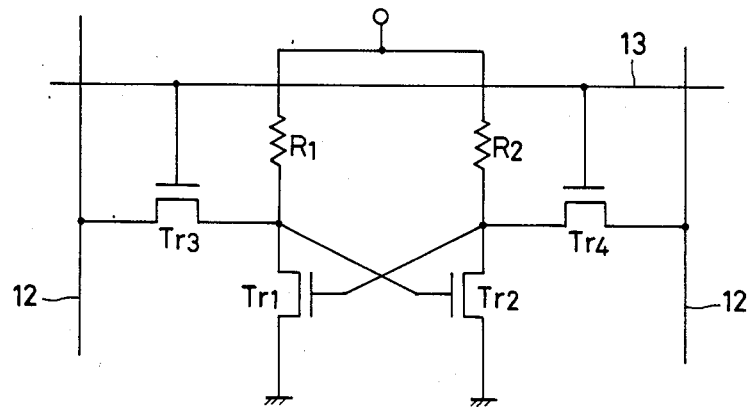
FIG. 1 is a circuit diagram showing a conventional static random-access memory.
Figure 2:
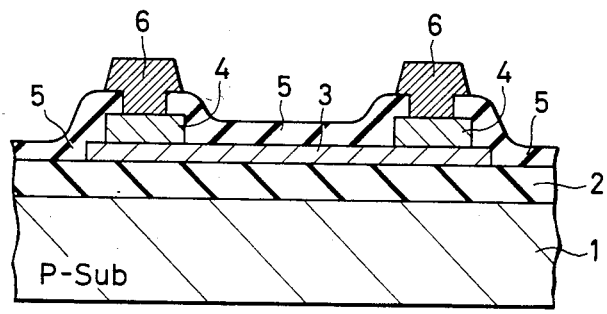
FIG. 2 is a sectional view of a conventional high-resistance element.
Figure 3:
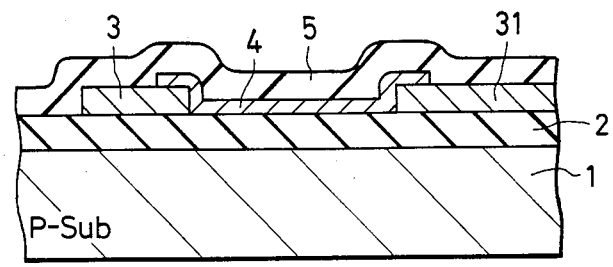
FIG. 3 is a sectional view showing a first embodiment of the present invention.

Referring first to FIG. 3, which shows the cross section of a first embodiment of the high-resistance element according to the present invention, polycrystalline silicon films 3 and 31, which are formed from a first-level conductor film (resistance film) having a thickness of 100 to 1000 nm, is formed on a silicon dioxide (SiO$_2$) layer which is formed on a silicon substrate 1 and which has a thickness of 50 to 500 nm. The first-level polycrystalline silicon films 3 and 31 have an impurity such as arsenic added thereto at a concentration of $10^{18}$ to $10^{21}$ cm$^{-3}$ to provide a low-resistance layer. A thin polycrystalline silicon film 4 which is formed from a second-level conductor film (resistance film) and which has a thickness of 10 to 200 nm is provided in such a manner that two end portions of the silicon film 4 are in direct contact with the first-level polycrystalline silicon films 3 and 31 without any SiO$_2$ interposed therebetween. The second-level polycrystalline silicon film 4 has no impurity added thereto. An inter-level insulator 5 such as SiO$_2$ having a thickness of 100 to 1000 nm is formed on portions of the first-level polycrystalline silicon films 3 and 31 which are not in contact with the second-level polycrystalline silicon film 4.

In the above-described structure, the second-level polycrystalline silicon film 4 having no impurity added thereto defines a high-resistance area, and the first-level polycrystalline silicon films 3 and 31 define interconnection areas which are respectively led to metal electrodes made of aluminum or the like. When the area of contact between the first-level polycrystalline silicon films 3, 31 and the second-level polycrystalline silicon film 4 is subjected to annealing in a manufacturing process carried out thereafter (for example, an annealing carried out at temperatures of 900° C. to 950° C., for 10–60 minutes), an impurity such as arsenic is redistributed into the contact area (including in the contact area of the second-level polycrystalline silicon film) from the heavily-doped first-level polycrystalline silicon films 3 and 31 to provide an electrical contact. Accordingly, the length of the high-resistance area is equal to a value obtained by subtracting an impurity diffusion length from the distance between the first-level polycrystalline silicon films 3 and 31, and thus determined by using a self-alignment technique, which means that the structure in accordance with this embodiment is suitable for achieving larger scale integration. Since the film thickness of the second-level polycrystalline silicon film 4 is sufficiently thinner than that of the first-level polycrystalline silicon films 3 and 31 (for example, when the first-level film has a thickness of about 2000Å, the second-level film has a thickness of 500–700Å), when the second-level polycrystalline silicon film 4 is processed by, for example, dry etching, even if over-etching is carried out due to nonuniformity in film thickness and etching rate the reduction in film thickness of the first-level polycrystalline silicon films 3 and 31 is very small as compared with the initial film thickness thereof. Accordingly, there is substantially no change in resistance as a result of the reduction in the film thickness. Further, since the first-level polycrystalline silicon films 3 and 31 have a low resistance, i.e., 10 to 100 Ω/□, they can be employed as interconnections. In addition, when contact holes are provided in the insulator 5 in order to connect the first-level polycrystalline silicon film portions 3 and 31 to respective metal electrodes of aluminum or the like, since the silicon films 3 and 31 have a relatively large film thickness there is no fear of the first-level polycrystalline silicon films 3 and 31 disappearing as a result of the over-etching which is necessary due to nonuniformity in film thickness of insulator 5 and nonuniformity in etching rate in the insulator 5, which disappearance would otherwise result in no electrical connection between the second-level polycrystalline silicon film 4 and the metal electrodes 6 of aluminum or the like, the net result of the present invention also including an improvement in the production yield in a manufacturing process.

EMBODIMENT 2

This embodiment relates to a static MOS memory cell which employs the high-resistance element according to the present invention.

Figure 4:
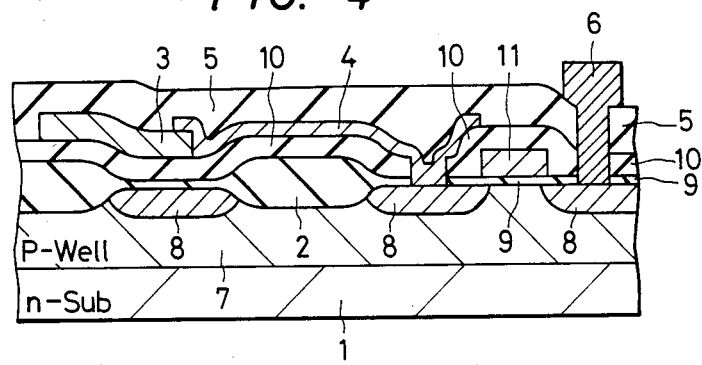
FIG. 4 is a sectional view showing a second embodiment of the present invention.

Referring to FIG. 4, which shows a cross section of a static MOS memory cell in accordance with this embodiment, a p-type well 7 is formed in an n-type silicon substrate 1, and an n-channel MOS transistor is formed in the p-type well 7, the MOS transistor consisting of n-type diffusion layers 8 (forming the source and drain of the MOS transistor, e.g., an MOS field effect transistor); a gate oxide 9; and a gate electrode 11 made of polycrystalline silicon, a metal silicide or a metal.

Such gate electrode 11 is formed from a first-level conductive film of the static MOS memory cell. An MOS transistor which is adjacent to the described MOS transistor is electrically isolated from the latter by a relatively thick field oxide layer having a thickness of 200 to 2000 nm. A second-level polycrystalline silicon film 3 which has an impurity such as arsenic added thereto at a concentration of $10^{17}$ to $10^{21}$ cm$^{-3}$ and which has a film thickness of 100 to 1000 nm is formed on the MOS transistor through an insulator layer 10 having a film thickness of 100 to 1000 nm. A third-level polycrystalline silicon film 4 which has no impurity added thereto and which has a film thickness of 20 to 200 nm is provided in such a manner that one end of the third-level polycrystalline silicon film 4 is in direct contact with the second-level polycrystalline silicon film 3 without any insulator or the like interposed therebetween. The other end of the third-level polycrystalline silicon film 4 is connected to the n-type diffused region 8 through a contact hole provided in the insulator layer 10 above the n-type diffused region 8. A small current required for a static operation is supplied to the diffused region 8 defining the drain of the MOS transistor from the second-level polycrystalline silicon film 3 connected to a power supply (e.g., 5 V) through the third-level high-resistance polycrystalline silicon film 4. In addition, it is possible to set the resistance to any desired value by varying the film thickness of the third-level polycrystalline silicon film 4 as desired. Therefore, it is possible to provide a static MOS memory cell including a small-sized high-resistance element and having a structure suitable for achieving larger scale integration by reducing the film thickness of the third-level polycrystalline silicon film 4.

EMBODIMENT 3

Figure 5:
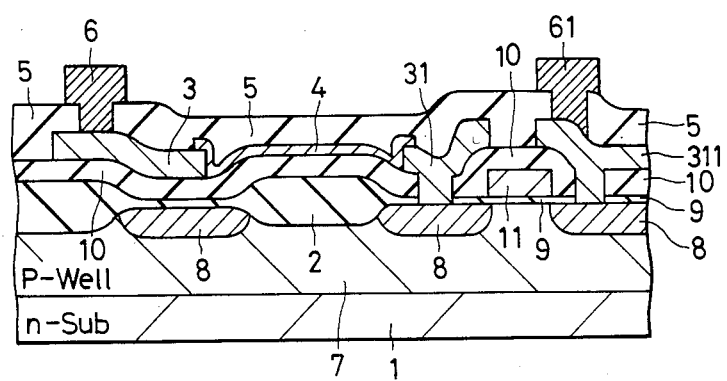
FIGS. 5 and 6A–6F are sectional views, and FIG. 7 a plan view, which show in combination a third embodiment of the present invention.

In this embodiment, the second-level polycrystalline silicon film in Embodiment 2 is also employed as an electrode which is connected to an n-type diffusion layer. Referring to FIG. 5, which shows the cross section of a static MOS memory cell in accordance with this embodiment, a power supply voltage is applied to the second-level polycrystalline silicon film 3 through a metal electrode 6 made of aluminum or the like. For example, the metal electrode can be directly connected to the second-level polycrystalline silicon film 3. The third-level polycrystalline silicon film 4 is not directly connected to the diffusion layer 8 of the MOS transistor but is connected thereto through a second-level polycrystalline silicon film 31. Similarly, an aluminum electrode 61 is connected to the diffusion layer 8 through a second-level polycrystalline silicon film 311. It should be noted that the second-level polycrystalline silicon films 3, 31 and 311 have an impurity such as arsenic added thereto at a concentration of $10^{18}$ to $10^{21}$ cm$^{-3}$ so as to be lowered in terms of resistance, whereas the third-level polycrystalline silicon film 4 has no impurity added thereto so as to define a high-resistance area.

According to this embodiment, the length of the high-resistance area is determined by the distance between the second-level polycrystalline silicon films 3 and 31, and it is possible to produce a static MOS memory including a load resistance element having a high resistance by reducing the film thickness of the third-level polycrystalline silicon film 4 in a manner similar to that of the above-described Embodiments 1 and 2. Further, since the metal electrode 6 made of aluminum or the like is not directly connected to the diffused region 8 of the MOS transistor but connected thereto through the second-level polycrystalline silicon film 311, the silicon film 311 can be formed in such a manner as to be stacked on the upper side of the gate electrode. It is therefore unnecessary to provide any margin for alignment between the gate electrode and the contact hole, which means that the structure in accordance with this embodiment is suitable for achieving larger scale integration. In addition, since all the connections with the aluminum electrodes 6 and 61 are obtained on the second-level polycrystalline silicon films 3, 31 and 311, the film thickness of the insulator 5 provided with contact holes can be made uniform, so that it is possible to improve the production yield.

The above-described semiconductor device is produced as follows.

Figure 6A:
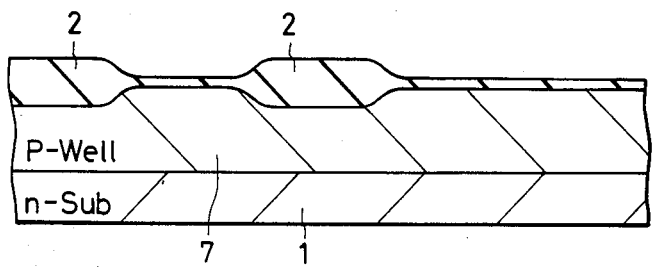
Figure 6B:
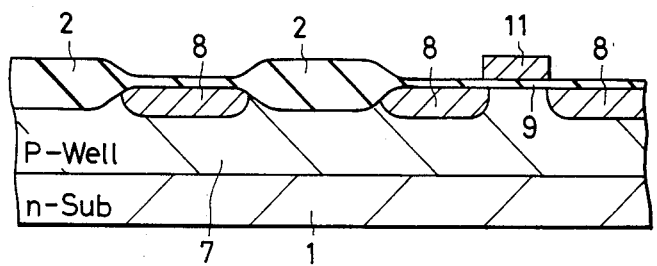
Figure 6C:
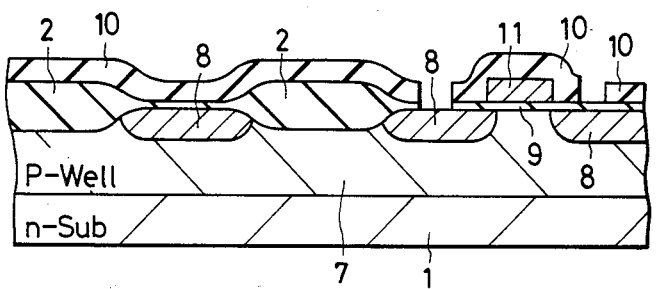
Figure 6D:
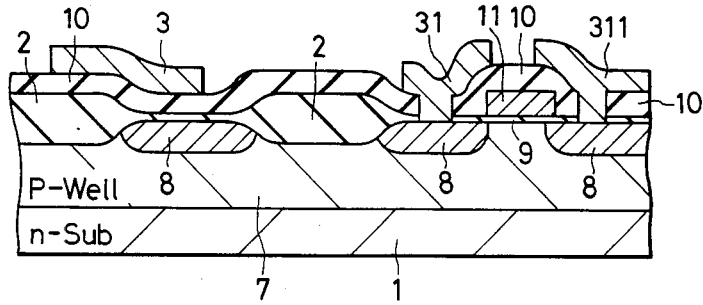
Figure 6E:
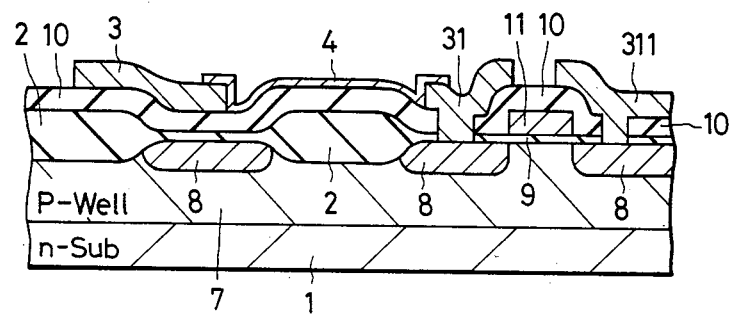
Figure 6F:
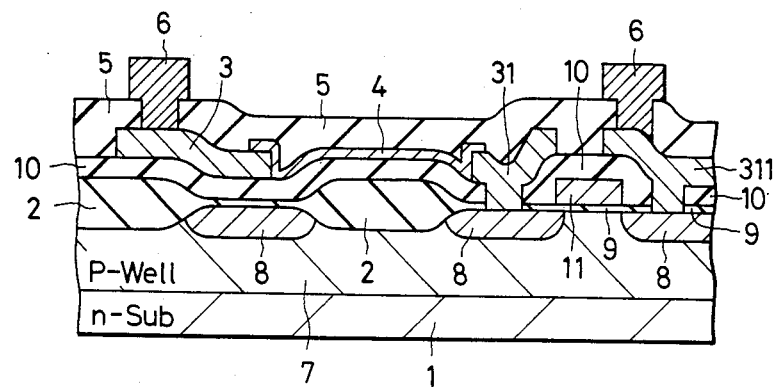

FIGS. 6A to 6D respectively show steps of the process for producing the static MOS memory according to the present invention. First, a p-type well 7 having an impurity concentration of $10^{15}$ to $10^{17}$ cm$^{-3}$ is formed in, for example, an n-type silicon substrate 1 by ion implantation and thermal diffusion, as conventionally done, and a thick field oxide 2 having a thickness of 200 to 100 nm is partially formed on the p-type well 7 by conventional LOCOS technique (see FIG. 6A). Next, a gate oxide film 9 having a thickness of 10 to 100 nm is formed, and impurity ions such as boron ions are implanted in order to control the threshold voltage of an MOS transistor. Then, a gate electrode 11 is formed using, for example, polycrystalline silicon (that is, a first-level polycrystalline silicon film) and impurity ions such as arsenic ions are implanted with said gate material employed as a mask, and activation is effected to form n-type diffusion layer 8 having an impurity concentration of $10^{17}$ to $10^{21}$ cm$^{-3}$ (see FIG. 6B). Then, an insulator film 10 such as SiO$_2$ having a thickness of 100 to 1000 nm is deposited by CVD (chemical vapor deposition), and contact holes are formed by photolithography and dry etching at positions where the n-diffusion layer 8 is to be connected to a second-level polycrystalline silicon film (see FIG. 6C). Then, a second-level polycrystalline silicon film 3 having a thickness of 100 to 1000 nm is deposited by CVD, and after an impurity such as arsenic has been added to the second-level polycrystalline silicon film 3 at a concentration of $10^{18}$ to $10^{21}$ cm$^{-3}$, patterning is effected by photolithography and dry etching (see FIG. 6D). Next, a third-level polycrystalline silicon film 4 having a thickness of 10 to 200 nm is deposited by CVD, and then similarly subjected to patterning (see FIG. 6E). Finally, an SiO$_2$ film 5 having a thickness of 100 to 1000 nm is deposited by CVD and provided with contact holes which reach the second-level polycrystalline silicon film 3. Aluminum having a thickness of 500 to 2000 nm is deposited and subjected to patterning to form electrodes 6 (see FIG. 6F). It should be noted that it is preferable for stabilizing the resistance of the high-resistance element to employ an SiO$_2$ film 5 which contains no phosphorus or a double layer film which consists of an SiO$_2$ film containing no phosphorus and an SiO$_2$ film containing phosphorus ( a phosphosilicate glass film).

Figure 7:
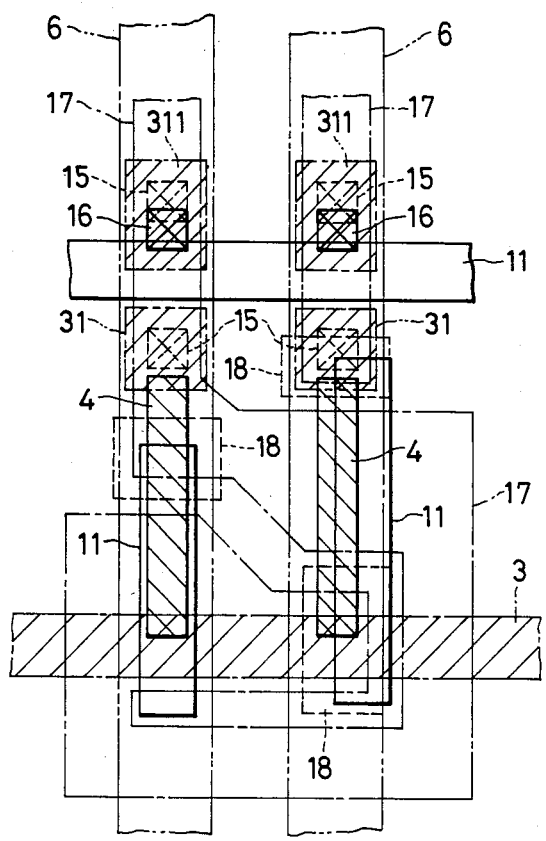

The planar layout of the static MOS memory cell in accordance with this embodiment will be explained with reference to FIG. 7. As illustrated, a second-level polycrystalline silicon film 3 is disposed within the memory as a feeder line for supplying a power supply voltage (e.g., 5 V) and connected to an aluminum electrode in the periphery of the memory. Other second-level polycrystalline silicon films 31 and 311 are formed by patterning so as to be disposed above contact holes 15 which are provided in such a manner as to reach the diffusion layers of MOS transistors. Further, contact holes 16 for providing connection between the second-level polycrystalline silicon films 311 and aluminum electrodes (data lines) 6 are formed above the silicon films 311. High-resistance elements are formed from third-level polycrystalline silicon films 4 and therefore lead to no increase in the memory cell area.

It should be noted that, although this embodiment has been described by way of n-channel MOS transistors, p-channel MOS transistors may also be employed to obtain similar advantages.

EMBODIMENT 4

This embodiment relates to a method of connecting together first- and second-level polycrystalline silicon films in the high-resistance element in accordance with Embodiment 1.

Figure 8:
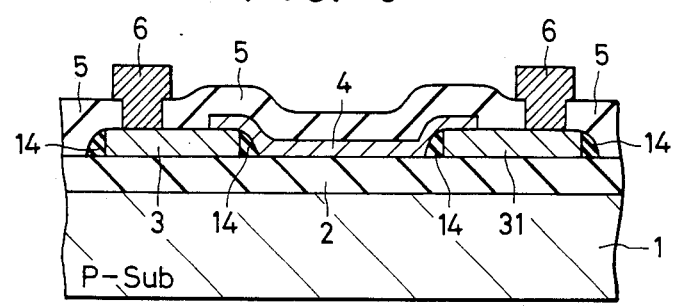
FIG. 8 is a sectional view showing a fourth embodiment of the present invention.

Referring to FIG. 8, which shows the cross section of the high-resistance element in accordance with this embodiment, side wall spacers 14 defined by an insulator such as $SiO_2$ are formed at the side walls of the first-level polycrystalline silicon film 3, by conventional techniques for forming side wall spacers (such as forming an $SiO_2$ layer all over the substrate (e.g., by CVD) and etching the $SiO_2$ layer, by reactive ion etching, so that $SiO_2$ remains only at the side walls of the polycrystalline silicon film 3). As for the process for forming the side wall spacers 14, see Tsang, et al., "Fabrication of High Performance LDDFET's with Oxide Sidewall-Spacer Technology", in *IEEE Transactions on Electron Devices*, Vol. ED-29, No. 4 (April 1982), pages 590–596, the contents of which are incorporated herein by reference. Such side wall spacers can have an aspect ratio (of side wall height (thickness) to width) of from 1 through 4, for example. Of course, the aspect ratio depends on the thickness of insulator 14; that is, the thicker the insulator layer provided, the wider the side wall (and the smaller the aspect ratio). The side wall spacers 14 are provided so that the second-level polycrystalline silicon film 4 is in contact with only the upper surface of the first-level polycrystalline silicon film 3.

This embodiment enables a reduction in the distance by which an impurity in the first-level polycrystalline silicon film 3 is redistributed into the second-level polycrystalline silicon film 4 during an annealing step. In addition, it is also possible to gentle the slope of the side walls of the first-level polycrystalline silicon film 3.

It should be noted that, although in Embodiments 1 to 4 a polycrystalline silicon has been exemplarily shown as the material for the resistance film, it is not necessarily limitative, and any insulator material (or other material) which is conductive to only a required extent, such as $Ta_2O_5$ or ion-implanted $SiO_2$, may be employed.

As will be understood from the above description, it is possible, according to the present invention, to obtain a high-resistance element having a reduced occupied area. It is also possible to obtain a high-resistance element having excellent resistance controllability. Further, it is possible to obtain a high-resistance element while facilitating the manufacturing process control. In addition, it is possible to produce a static MOS memory cell which includes a high-resistance element with a reduced necessary area and which is suitable for achieving larger scale integration, with ease and with an excellent production yield.

It is further understood by those skilled in the art that the foregoing description describes preferred embodiments of the disclosed device and that various changes and modifications may be made in the invention without departing from the spirit and scope thereof.

What is claimed is:

1. A static random access memory comprising:
    a plurality of memory cells each of which has a flip-flop circuit comprising driver MOS transistors, load resistors and transfer MOS transistors,
    wherein a source or drain electrode of a first one of the driver MOS transistors is electrically connected to one of the load resistors, to a source or drain electrode of a first one of the transfer MOS transistors, and to a gate electrode of a second one of the driver MOS transistors,
    wherein a source or drain electrode of the second one of the driver MOS transistors is electrically connected to a second one of the load resistors, to a source or drain electrode of a second one of the transfer MOS transistors and to a gate electrode of the first one of the driver MOS transistors, and
    wherein a drain or source electrode of each of the first one and the second one of the driver MOS transistors is electrically connected to a first voltage supply electrode;
    a plurality of word lines for selecting one of the memory cells, each of which word lines are electrically connected to a gate electrode of the transfer MOS transistors;
    a plurality of pairs of data lines for selecting one of the memory cells, each of which data lines are electrically connected to a source or drain electrode of the transfer MOS transistors, one of the pair of data lines having "HIGH" level data, the other of the pair of data lines having "LOW" level data;
    a plurality of power supply voltage electrode means for supplying power to the memory cells, each of which power supply voltage electrode means is electrically connected to the load resistors,
    wherein each load resistor comprises:
        a first conductor film, and
        a second conductor film having a smaller thickness than that of said first conductor film and having a higher resistivity than that of said first conductor film, said second conductor film being provided in such a manner as to be stacked over at least a part of said first conductor film, said first and second conductor films being electrically connected together at the stacked part, and
    wherein gate electrodes of the transfer MOS transistors and driver MOS transistors are formed by a first-level conductive layer, the first conductor film is formed by a second-level conductive layer, and the second conductor film is formed by a third-level conductive layer.

2. A static random access memory according to claim 1, wherein said first and second conductor films are made of polycrystalline silicon, respectively, the impurity concentration of the polycrystalline silicon of said first conductor film being higher than that of the polycrystalline silicon of said second conductor film.

3. A static random access memory according to claim 2, wherein the relatively thick polycrystalline silicon of first conductor film has been doped with an impurity, and wherein said relatively thick polycrystalline silicon and the relatively thin polycrystalline silicon of said second conductor film are electrically connected together by means of redistribution of said impurity from said thick polycrystalline silicon into said thin polycrystalline silicon by a heat treatment.

4. A static random access memory according to claim 1, wherein said first conductor film is employed as an interconnection for supplying a power supply voltage in said memory cell.

5. A static random access memory according to claim 1, wherein the second conductor film is covered by a second insulator film, the second insulator film being made of silicon dioxide, the silicon dioxide being free of phosphorus adjacent the second conductor film.

6. A static random access memory according to claim 5, wherein the second insulator film includes two sub-films: a first sub-film, adjacent the second conductor film, of $SiO_2$ containing no phosphorus, and a second sub-film, on the first sub-film, of $SiO_2$ containing phosphorus, the second sub-film being a phosphosilicate glass layer.

7. A static random access memory according to claim 1, wherein the second conductor film is directly connected to said source or drain region of one of the MOS transistors.

8. A static random access memory according to claim 1, wherein said first conductor film comprises a portion extending through the first insulator layer so as to contact said source or drain region of one of the MOS transistors, and wherein said second conductor film is electrically connected to the portion of the first conductor film extending through the first insulator layer.

9. A static random access memory according to claim 8, wherein the second conductor film directly contacts said portion of the first conductor film.

10. A static random access memory according to claim 1, wherein said second conductor film extends on the top and by a side of the first conductor film, and wherein said first conductor film is provided at at least said side thereof with a side wall spacer for decreasing the slope of the step at said side of the first conductor film.

11. A static random access memory according to claim 1, wherein said second conductor film is defined by either a thin $Ta_2O_5$ film or a thin ion-implanted silicon oxide film.

12. A static random access memory according to claim 1, wherein said first conductor film is employed as an interconnection for said memory cell.

13. A static random access memory according to claim 1, further comprising:
a further conductor film which is formed between a source or drain electrode of one of the driver MOS transistors and a wiring layer,
wherein a contact hole for the contact between the further conductor film and wiring layer is provided above the gate electrode of the one of driver MOS transistors.

14. A static random access memory according to claim 13, wherein the further conductor film is formed of the first-level conductive layer, the second-level conductive layer being comprised of polycrystalline silicon.

15. A static random access memory according to claim 1, wherein the first-, second- and third-level conductive layers are comprised of polycrystalline silicon.

16. A static random access memory according to claim 1, wherein the first and second conductor films are in direct contact.

17. A static random access memory according to claim 1, wherein the power supply voltage electrode means is formed of the second-level conductive layer.

18. A resistance element comprising:
a substrate;
a first insulator layer provided on said substrate;
a first conductor film provided on said first insulator layer, said first conductor film being formed of heavily doped polycrystalline silicon of a first-level conductive film; and
a second conductor film having a smaller thickness than that of said first conductor film and having a higher resistivity than that of said first conductor film, said second conductor film being formed of polycrystalline silicon having had no impurity doped thereinto, of a second-level conductive film different than the first-level conductive film, said second conductor film being provided in such a manner as to be stacked over at least a part of said first conductor film, said first and second conductor films being electrically connected together at the stacked part.

19. A resistance element according to claim 18, wherein the substrate is a semiconductor substrate having at least one MOS transistor therein, the at least one MOS transistor having at least one of a source and drain region, with the second conductor film being in electrical connection with a source or drain region of one of at least one the MOS transistors.

20. A resistance element according to claim 18, further comprising means for supplying a power supply voltage to the second conductor film, via the first conductor film.

21. A resistance element according to claim 18, wherein the first and second conductor films are electrically connected together by means of redistribution of the impurity from the heavily doped impurity in the first conductor film into the second conductor film by a heat treatment.

22. A resistance element according to claim 18, wherein the second conductor film is in direct contact with the first conductor film.

* * * * *